US005695907A

United States Patent [19]

Chang

[11] Patent Number: 5,695,907

[45] Date of Patent: Dec. 9, 1997

[54] LASER ADDRESSABLE THERMAL TRANSFER IMAGING ELEMENT AND METHOD

[75] Inventor: Jeffrey C. Chang, North Oaks, Minn.

[73] Assignee: Minnesota Mining and Manufacturing Company, St. Paul, Minn.

[21] Appl. No.: 615,932

[22] Filed: Mar. 14, 1996

[51] Int. Cl.[6] .................... G03F 7/34; G03C 5/16

[52] U.S. Cl. .................... 430/201; 430/200; 430/273.1; 430/944; 430/964; 503/227

[58] Field of Search .................... 430/200, 201, 430/964, 273.1, 944; 503/227

[56] References Cited

U.S. PATENT DOCUMENTS

| | | | |
|---|---|---|---|
| 4,123,578 | 10/1978 | Perrington et al. | 428/206 |
| 4,711,834 | 12/1987 | Butters et al. | 430/201 |
| 4,822,643 | 4/1989 | Chou et al. | 427/256 |
| 4,839,224 | 6/1989 | Chou et al. | 428/323 |
| 5,156,938 | 10/1992 | Foley et al. | 430/200 |
| 5,171,650 | 12/1992 | Ellis et al. | 430/20 |
| 5,256,506 | 10/1993 | Ellis et al. | 430/20 |
| 5,278,023 | 1/1994 | Bills et al. | 430/201 |
| 5,308,737 | 5/1994 | Bills et al. | 430/201 |
| 5,429,909 | 7/1995 | Kaszczuk et al. | 430/201 |

*Primary Examiner*—Richard L. Schilling
*Attorney, Agent, or Firm*—Gary L. Griswold; Walter N. Kirn; H. Sanders Gwin, Jr.

[57] ABSTRACT

The invention provides a thermal transfer element having an infrared sensitive adhesive topcoat and process for using the transfer element to generate a colored image on a receptor. The infrared sensitive adhesive topcoat allows for a more efficient transfer of the image to a receptor. The color transfer layer and/or infrared sensitive adhesive topcoat may optionally contain crosslinkable or polymerizable materials that allows one to crosslink the image after transfer to the receptor to produce a more durable image.

19 Claims, No Drawings

LASER ADDRESSABLE THERMAL TRANSFER IMAGING ELEMENT AND METHOD

FIELD OF THE INVENTION

This invention relates to a thermal transfer imaging element, in particular, to a laser addressable thermal transfer element having an infrared sensitive thermoplastic topcoat. In addition, the invention relates to a method of using the thermal transfer element in a laser addressable system.

BACKGROUND OF THE ART

With the increase in electronic imaging information capacity and use, a need for imaging systems capable of being addressed by a variety of electronic sources is also increasing. Examples of such imaging systems include thermal transfer, ablation (or transparentization) and ablation-transfer imaging. These imaging systems have been shown to be useful in a wide variety of applications, such as, color proofing, color filter arrays, printing plates, and reproduction masks.

The traditional method of recording electronic information with a thermal transfer imaging medium utilizes a thermal printhead as the energy source. The information is transmitted as electrical energy to the printhead causing a localized heating of a thermal transfer donor sheet which then transfers material corresponding to the image data to a receptor sheet. The two primary types of thermal transfer donor sheets are dye sublimation (or dye diffusion transfer) and thermal mass transfer. Representative examples of these types of imaging systems can be found in U.S. Pat. Nos. 4,839,224 and 4,822,643. The use of thermal printheads as an energy source suffer several disadvantages, such as, size limitations of the printhead, slow image recording speeds (milliseconds), limited resolution, limited addressability, and artifacts on the image from detrimental contact of the media with the printhead.

The increasing availability and use of higher output compact lasers, semi-conductor light sources and laser diodes which emit in the visible and particularly in the near-infrared and infrared region of the electromagnetic spectrum, have allowed the use of these sources as viable alternatives for the thermal printhead as an energy source. The use of lasers and laser diodes as the imaging source is one of the primary and preferred means for transferring electronic information onto an image recording media. Lasers and laser diodes provide higher resolution and more flexibility in format size of the final image than the traditional thermal printhead imaging systems. In addition, lasers and laser diodes provide the advantage of eliminating the detrimental effects from contact of the media with the heat source. As a consequence, a need exists for media that have the ability to be efficiently exposed by these sources and have the ability to form images having high resolution and improved edge sharpness.

It is well known in the art to incorporate light-absorbing layers in the thermal transfer constructions to act as light-to-heat converters, thus allowing non-contact imaging using lasers or laser diodes as energy sources. Representative examples of these types of elements can be found in U.S. Pat. Nos. 5,308,737; 5,278,023; 5,256,506; and 5,156,938.

U.S. Pat. No. 5,171,650 discloses methods and materials for thermal imaging using an "ablation-transfer" technique. The donor element used in the imaging process comprises a support, an intermediate dynamic release layer, and an ablative carrier topcoat containing a colorant. Both the dynamic release layer and the color carrier layer may contain an infrared-absorbing (light to heat conversion) dye or pigment. A colored image is produced by placing the donor element in intimate contact with a receptor and then irradiating the donor with a coherent light source in an imagewise pattern. The colored carrier layer is simultaneously released and propelled away from the dynamic release layer in the light struck areas creating a colored image on the receptor.

Co-pending U.S. application Ser. No. 07/855,799 filed Mar. 23, 1992 discloses ablative imaging elements comprising a substrate coated on a portion thereof with an energy sensitive layer comprising a glycidyl azide polymer in combination with a radiation absorber. Demonstrated imaging sources included infrared, visible, and ultraviolet lasers. Solid state lasers were disclosed as exposure sources, although laser diodes were not specifically mentioned. This application is primarily concerned with the formation of relief printing plates and lithographic plates by ablation of the energy sensitive layer. No specific mention of utility for thermal mass transfer was made.

U.S. Pat. No. 5,308,737 discloses the use of black metal layers on polymeric substrates with gas-producing polymer layers which generate relatively high volumes of gas when irradiated. The black metal (e.g., aluminum) absorbs the radiation efficiently and converts it to heat for the gas-generating materials. It is observed in the examples that in some cases the black metal was eliminated from the substrate, leaving a positive image on the substrate.

U.S. Pat. No. 5,278,023 discloses laser-addressable thermal transfer materials for producing color proofs, printing plates, films, printed circuit boards, and other media. The materials contain a substrate coated thereon with a propellant layer wherein the propellant layer contains a material capable of producing nitrogen ($N_2$) gas at a temperature of preferably less than about 300° C.; a radiation absorber; and a thermal mass transfer material. The thermal mass transfer material may be incorporated into the propellant layer or in an additional layer coated onto the propellant layer. The radiation absorber may be employed in one of the above-disclosed layers or in a separate layer in order to achieve localized heating with an electromagnetic energy source, such as a laser. Upon laser induced heating, the transfer material is propelled to the receptor by the rapid expansion of gas. The thermal mass transfer material may contain, for example, pigments, toner particles, resins, metal particles, monomers, polymers, dyes, or combinations thereof. Also disclosed is a process for forming an image as well as an imaged article made thereby.

Laser-induced mass transfer processes have the advantage of very short heating times (nanoseconds); whereas, the conventional thermal mass transfer methods are relatively slow due to the longer dwell times (milliseconds) required to heat the printhead and transfer the heat to the donor. However, the resulting images generated in the laser-induced systems are often fragmented and exhibit low adhesion to the receptor. Therefore, there is a need for a thermal transfer system that takes advantage of the speed and efficiency of laser addressable systems without sacrificing image quality or resolution.

SUMMARY OF THE INVENTION

The present invention relates to a thermal color transfer element comprising a substrate having deposited thereon (a) a light-to-heat conversion layer, (b) a color transfer layer, and (c) a thermally transferable infrared sensitive adhesive topcoat. The infrared sensitive adhesive topcoat comprises an infrared absorber and a thermoplastic material which softens when irradiated with an infrared radiation source. The color transfer layer and/or the infrared sensitive adhesive topcoat may additionally comprise crosslinkable or polymerizable materials.

The present invention also provides a method for generating an image on a receptor using the above described thermal color transfer element. A colored image is transferred onto a receptor by (a) placing in intimate contact a receptor and the thermal color transfer element described above, (b) exposing the thermal transfer element in an imagewise pattern with an infrared radiation source, and (c) simultaneously transferring the color transfer layer and adhesive topcoat corresponding to the imagewise pattern to the receptor. When the color transfer layer and/or infrared sensitive adhesive topcoat contains crosslinkable or polymerizable materials, an additional exposing step may be performed where the transferred image is exposed with a second radiation source to crosslink the image.

As used herein the phrase "thermally melt stick materials" refers to thermal mass transfer materials on a donor surface which, when thermally addressed, stick to a receptor surface with greater strength than they adhere to the donor surface and physically transfer when the surfaces are separated.

The phrase "in intimate contact" refers to sufficient contact between two surfaces such that the transfer of materials may be accomplished during the imaging process to provide a uniform (complete) transfer of material within the thermally addressed areas. In other words, no visible voids are observable in the imaged areas due to incomplete transfer of materials.

DETAILED DESCRIPTION

A thermal color transfer element is provided comprising a light transparent substrate having deposited thereon, in the following order, a light-to-heat conversion (LTHC) layer, a color transfer layer, and an infrared sensitive adhesive topcoat. The substrate is typically a polyester film. However, any film that has sufficient transparency at the imaging IR wavelength (e.g., between 720 and 1200 nm) and sufficient mechanical stability can be used.

The light-to-heat conversion (LTHC) layer can be essentially any black body absorber which is capable of absorbing at least a portion of the imaging radiation, e.g., from an Infrared (IR) radiation source and converting the absorbed radiation to heat. Suitable absorbers, particularily IR absorbers include pigments, such as carbon black, bone black, iron oxide, copper/chrome complex black azo pigment (i.e., prazolone yellow, dianisidine red, and nickel azo yellow), and phthalocyanine pigments, and dyes such as nickel dithiolenes, nickel thiohydrizides, diradical dicationic dyes (i.e., Cyasorb™ IR-165 and 126 available from American Cyanamid), dialkylaminothiophenes, pyryliums, azulenes, indolizines, perimidines, azaazulenes, and other dye classes listed in Matsuoka, M., *Absorption Spectra of Dyes for Diode Lasers*, Bunchin Publishing Co., Tokyo (1990). If a pigment is used, the particle size is preferably less than the wavelength of the imaging radiation source to allow unabsorbed radiation to transmit through the LTHC layer to the IR sensitive thermoplastic topcoat. If a dye is used, the dye is preferably soluble in the coating solvent and compatible with the binder used in the layer to provide a transparent or semi-transparent coating capable of transmitting sufficient radiation through the LTHC layer to the IR sensitive thermoplastic topcoat to enhance the transfer of the image.

Suitable binders for use in the LTHC layer include film-forming polymers that are visibly transparent, such as for example, phenolic resins (i. e., novolak and resole resins), polyvinyl resins, polyvinylacetates, polyvinyl acetals, polyvinylidene chlorides, polyacrylates, cellulosic ethers and esters, nitrocelluloses, and polycarbonates. Preferably, the polymers are highly thermally sensitive, more preferably thermally decomposable at the imaging conditions. The amount of binder used is maintained at a minimal level so that heat generated by the IR absorber is not excessively consumed by the binder. The absorber-to-binder ratio is generally from 5:1 to 1:20 by weight depending on what type of absorbers and binders are used. Optionally a soluble IR absorbing dye is coated without a polymeric binder. Binderless coatings help improve thermal ablation or transfer properties. Conventional coating aids, such as surfactants and dispersing agents, may be added to facilitate the coating process. The LTHC layer may be coated onto the substrate using a variety of coating methods known in the art. Preferably, the LTHC layer is coated to a thickness of 0.05 to 5.0 micrometers, more preferably 0.1 to 2.0 micrometers. For optimum results, the LTHC layer allows at least 10% of the imaging radiation to be transmitted through the LTHC layer so that the radiation may be absorbed in the IR absorbing adhesive topcoat. The light absorbance of the LTHC layer at the laser wavelength output is preferably between 1.3 and 0.1, more preferably between 1.0 and 0.3 absorbance units.

A preferred LTHC layer is a metal or metal/metal oxide layer (e.g. black aluminum which is a partially oxidized aluminum having a black visual appearance). Substantially any metal capable of forming an oxide or sulfide can be used in the practice of this invention for the black metal layer. In particular aluminum, tin, chromium, nickel, titanium, cobalt, zinc, iron, lead, manganese, copper and mixtures thereof can be used. Not all of these metals, when converted to metal oxides according to deposition processes will form materials having all of the specifically desirable properties (e.g., optical density, light transmissivity, etc.). However, all of these metal or metal oxide containing layers can be useful and provide many of the benefits of the present process including bondability to polymeric materials. The metal vapors in the chamber may be supplied by any of the various known techniques suitable for the particular metals, e.g., electron beam vaporization, resistance heaters, etc. Reference is made to *Vacuum Deposition Of Thin Films*, L. Holland, 1970, Chapman and Hall, London, England with regard to the many available means of providing metal vapors and vapor coating techniques, in general.

Metal oxide or metal sulfide containing layers, exemplary of the black metal layers according to the present invention, may be deposited as thin as layers of molecular dimensions up through dimensions in micrometers. The composition of the layer throughout its thickness may be readily controlled as herein described. Preferably the metal/metal oxide or sulfide layer will be between 50 and 5000 Å in its imaging utilities, but may contribute bonding properties when 15 Å, 25 Å or smaller and structural properties when $5\times10^4$ Å or higher.

The conversion to graded metal oxide or metal sulfide is effected by the introduction of oxygen, sulfur, water vapor or hydrogen sulfide at points along the metal vapor stream. By thus introducing these gases or vapors at specific points along the vapor stream in the vapor deposition chamber, a coating of a continuous or graded composition (throughout either thickness of the layer) may be obtained. By selectively maintaining a gradation of the concentration of these reactive gases or vapors across the length of the vapor deposition chamber through which the substrate to be coated is being moved, an incremental gradation of the composition of the coating layer (throughout its thickness) is obtained because of the different compositions (i.e., different ratios of oxides or sulfides to metals) being deposited in different regions of the vapor deposition chamber. One can in fact deposit a layer comprising 100% metal at one surface (the top or bottom of the coating layer) and 100% metal oxide or sulfide at the other surface. This kind of construction is a particularly desirable one because it provides a strong coherent coating layer with excellent adhesion to the substrate.

A substrate which is to be coated continuously moves along the length of the chamber from an inlet area of the vapor deposition chamber to an outlet area. Metal vapor is deposited over a substantial length of the chamber, and the proportion of metal oxide or sulfide being co-deposited with the metal at any point along the length of the chamber (or deposited as 100% oxide or sulfide) depends upon the amount of reactive gas or vapor which has entered that portion of the metal vapor stream which is being deposited at that point along the length of the chamber. Assuming, for purposes of illustration, that an equal number of metal atoms (as metal or oxides or sulfides) are being deposited at any time at any point along the length of the chamber, gradation in the deposited coating is expected by varying the amount of oxygen or sulfur containing reactive gas or vapor which contacts the metal vapor at various points or areas along the length of the chamber. By having a gradation of increasing amounts of reactive gas along the length of the chamber, one gets a corresponding gradation in the increased proportions of oxide or sulfide deposited. Deposition of metal vapor is seldom as uniform as that assumed, but in actual practice it is not difficult to locally vary the amount of oxygen, water, sulfur or hydrogen sulfide introduced into different regions of said metal vapor along the length of the surface of the substrate to be coated as the substrate is moved so as to coat the surface with a layer having varying ratios of metal/(metal oxide or sulfide) through its thickness. It is desirable that the reactive gas or vapor enter the stream itself and not just diffuse into the stream. The latter tends to cause a less controllable distribution of oxides within the stream. By injecting or focusing the entrance of the reactive gas or vapor into the stream itself, a more consistent mixing in that part of the stream is effected.

Transitional characteristics bear an important relationship to some of the properties of the black metal products. The coating has dispersed phases of materials therein, one the metal and the other the metal oxide or sulfide. The latter materials are often transparent or translucent, while the former are opaque. By controlling the amount of particulate metal which remains dispersed in the transparent oxide or sulfide phase, the optical properties of the coating can be dramatically varied. Translucent coatings of yellowish, tan, and gray tones may be provided, and substantially opaque black film may be provided from a single metal by varying the percentage of conversion of the metal to oxide during deposition of the coating layer.

The color transfer layer comprises at least one organic or inorganic colorant (i.e., pigments or dyes) and a thermoplastic binder. Other additives may also be included such as an IR absorber, dispersing agents, surfactants, stabilizers, plasticizers and coating aids. Any pigment may be used, but preferred are those listed as having good color permanency and transparency in the NPIRI Raw Materials Data Handbook, Volume 4 (Pigments). Either non-aqueous or aqueous pigment dispersions may be used. The pigments are generally introduced into the color formulation in the form of a millbase comprising the pigment dispersed with a binder and suspended into a solvent or mixture of solvents. The pigment type and color are chosen such that the color coating is matched to a preset color target or specification set by the industry. The type of dispersing resin and the pigment-to-resin ratio will depend upon the pigment type, surface treatment on the pigment, dispersing solvent and milling process used in generating the millbase. Suitable dispersing resins include vinyl chloride/vinyl acetate copolymers, poly(vinyl acetate)/crotonic acid copolymers, styrene maleic anhydride half ester resins, (meth)acrylate polymers and copolymers; poly(vinyl acetals), poly(vinyl acetals) modified with anhydrides and amines, hydroxy alkyl cellulose resins and styrene acrylic resins. A preferred color transfer coating composition comprises 30–80% by weight pigment, 15–35% by weight resin, and 0–20% by weight dispersing agents.

The amount of binder present in the color transfer layer is kept to a minimum to avoid loss of image resolution due to excessive cohesion in the color transfer layer. The pigment-to-binder ratio is typically between 4:1 to 1:2 by weight depending on the type of pigments and binders used. The binder system may also include polymerizable ethylenically unsaturated materials (i.e., monomers, oligomers or prepolymers) and an initiator system. Using monomers or oligomers assists in reducing the binder cohesive force in the color transfer layer, therefore improving transferred image resolution. Incorporation of a polymerizable composition into the color transfer layer allows one to produce a more durable and solvent resistant image. A highly crosslinked image is formed by first transferring the image to a receptor and then exposing the transferred image to radiation to crosslink the polymerizable materials. The crosslinking step may be accomplished by either photoinitiation or thermal initiation. Any radiation source can be used that is absorbed by the initiator system used in the polymerizable composition, preferably an ultraviolet sensitive photoinitiator system with an ultraviolet radiation source. Ultraviolet sensitive initiator systems are well known in the art and are commercially available from a variety of sources. Thermal initiators are also well known in the art. Preferably the initiator system contributes minimal color both before and after exposure to the radiation source. Suitable thermal initiators include commercially available peroxides and metal catalyst systems. Suitable photoinitiator systems include triazines, acetophenones, benzophenones, iodonium slats, sulfonium salts, and thioxanthones. Suitable monomers include polyfunctional acrylates or methacrylates, such as 1,3-butanediol diacrylate, tetramethyl glycol diacrylate, and propylene glycol diacrylate. Suitable oligomers include materials such as ester compounds of unsaturated carboxylic acids and aliphatic polyhydric alcohols, acrylated urethanes (such as those disclosed in U.S. Pat. No. 4,304,923) and ethylenically unsaturated azlactones (such as those disclosed in U.S. Pat. No. 4,304,705).

The color transfer layer may be coated by any conventional coating method known in the art. It may be desirable to add coating aids such as surfactants and dispersing agents to provide an uniform coating. Preferably, the layer has a thickness from about 0.4 to 4.0 micrometers, more preferably from 0.5 to 2.0 micrometers.

Adjacent to the color transfer layer is an infrared (IR) sensitive adhesive topcoat comprising an infrared absorber and a thermally activated adhesive. The IR sensitive adhesive topcoat provides improved transfer of the color transfer layer to a receptor by means of a thermally activated adhesive. The adhesive topcoat is preferably colorless; however, in some applications a translucent or opaque adhesive may be desirable to enhance the color density of the image or to provide special effects. For liquid crystal display applications, the adhesive is preferably colorless and transparent. The adhesive topcoat is preferably non-tacky at room temperature and may include slip agents (i.e., waxes, silica, polymeric beads) to reduce tack so long as the additives do not interfere with the adhesion of the imaged layer to the receptor. Preferred adhesives include thermoplastic materials having melting temperatures between approximately 30° C. and 110° C. Suitable thermoplastic adhesives include materials such as polyamides, polyacrylates, polyesters, polyurethanes, polyolefins, polystyrenes, polyvinyl resins, copolymers and combination thereof. The adhesive may also include thermal or photochemical crosslinkers to provide thermal stability and solvent resistance to the transferred image. Crosslinkers include monomers, oligomers and polymers which may be crosslinked thermally or photochemically by either external initiator systems or internal self-initiating groups. Thermal crosslinkers include materials capable of crosslinking when subjected to thermal energy.

Any IR absorbing materials may be used in the adhesive topcoat; however, the IR absorber is preferably colorless and soluble in the coating solvent used to deposit the adhesive topcoat onto the color transfer layer. Suitable IR absorbers include diradical dicationic dyes such as Cyasorb™ IR-165 and IR-126 available from American Cyanamid. The concentration of IR absorber may vary depending upon the amount of heat needed to activate the adhesive. When an adhesive topcoat is used without the incorporation of an IR absorber, the activation of the adhesive is dependent upon the conduction of heat from the adjacent layers. By incorporating an IR absorber into the adhesive layer, the adhesive topcoat may be activated directly during the imaging process. Direct activation of the adhesive provides more efficient transfer of the image to the receptor. The amount of IR absorber incorporated into the adhesive is chosen such that sufficient heat is generated to activate the adhesive without excessive heating. Excessive heating may cause bubbles to form within the layer or disintegration of the layer. The IR-absorber to binder ratio is generally from 1:50 to 1:8 by weight. Typically, adhesives with lower Tg's (glass transition temperatures) or Tm's (melting temperatures) require less concentrations of IR absorber due to the lower thermal activation energy of the adhesive materials. The IR absorber may be dispersed or solubilized into the adhesive materials. For optimum performance, the IR absorber is uniformly distributed through out the adhesive topcoat.

The IR sensitive adhesive topcoat may be coated onto the color transfer layer by any conventional coating process known in the art. When cast from a solution, the solvent is chosen such that interaction with the underlying color transfer layer is minimized. The thickness of the adhesive topcoat is preferably between 2.0 and 0.05 micron, more preferably between 1.0 and 0.05 micron, and most preferably between 0.5 and 0.1 micron.

The process of the present invention may be performed by fairly simple steps. During imaging, the donor sheet is brought into intimate contact with a receptor sheet under pressure or vacuum. An Infrared laser or an array of lasers is then used to heat the IR absorbing layers in an imagewise fashion to perform simultaneous removal and transfer of the image from the donor to the receptor. During the laser-induced thermal transfer process, the LTHC layer absorbs and converts a major portion of the incident light to heat causing imagewise removal of the LTHC layer, and release of the overlying portions of the color transfer layer and adhesive topcoat. Concurrently, the IR absorbing adhesive topcoat absorbs and converts a portion of the incident light to heat, thus activating the adhesive to provide adhesion of the image to the receptor.

A variety of light-emitting sources can be utilized in the present invention including infrared, visible, and ultraviolet lasers. The preferred lasers for use in this invention include high power (>100 mW) single mode laser diodes, fiber-coupled laser diodes, and diode-pumped solid state lasers (e.g., Nd:YAP and Nd:YLF). The laser exposure should raise the temperature of the thermal transfer medium above 150° C. and most preferably above 200° C. Laser exposure dwell times should be from about 0.1 to 5 microseconds and laser fluences should be from about 0.01 to about 1 Joules/$cm^2$.

In the practice of the invention, the focal depth is preferably equal to or greater than the combined thicknesses of the light-to-heat conversion layer, the color layer and the infrared sensitive adhesive topcoat. The total thickness of the imaging layers is typically less than 10 micrometers, and preferably less than 5 micrometers. The imaging layers include the LTHC layer, the color transfer layer, and the IR sensitive adhesive topcoat.

During laser exposure, it may be desirable to minimize formation of interference patterns due to multiple reflections from the imaged material. This can be accomplished by various methods. The most common method is to effectively roughen the surface of the donor material on the scale of the incident radiation as described in U.S. Pat. No. 5,089,372. This has the effect of disrupting the spatial coherence of the incident radiation, thus minimizing self interference. An alternate method is to employ the use of an antireflection coating on the second interface that the incident illumination encounters. The use of anti-reflection coatings is well known in the art, and may consist of quarter-wave thicknesses of a coating such as magnesium fluoride, as described in U.S. Pat No. 5,171,650. Due to cost and manufacturing constraints, the surface roughening approach is preferred in many applications.

Suitable receptors are well known to those skilled in the art. Non-limiting examples of receptors which can be used in the present invention include anodized aluminum and other metals; transparent polyester films (e.g., PET); and a variety of different types of paper (e.g., filled or unfilled, calendered, coated, etc.)

The following non-limiting examples further illustrate the present invention.

EXAMPLES

Materials used in the following examples are available from standard commercial sources such as Aldrich Chemical Co. (Milwaukee, Wis.) unless otherwise specified.

The infrared absorber IR-165 used in the following examples has the following structure and is available from American Cyanamid, Wayne, N.J..

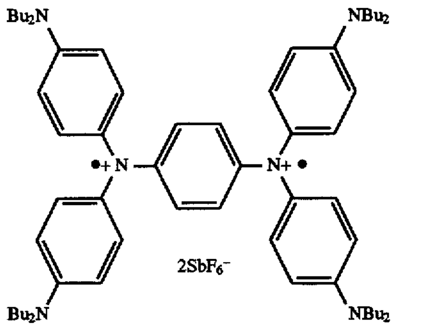

IR-165

Preparation of Black Aluminum Coated Polyester Film

Black aluminum (aluminum oxide) was deposited onto one side a 4 mil (0.1 mm) polyester substrate. The aluminum was sputtered onto the polyester in an Argon/Oxygen atmosphere in a continuous vacuum coater under the following conditions:

Sputtering Voltage: 455 volts

Vacuum System Pressure: $1.3\times10^{-2}$ torr

Oxygen/Argon Flow Ratio: 0.008

Substrate Transport Speed: 3.0 ft/min The coating conditions above gave rise to a black aluminum coated film having an absorbance equal to 0.77 at 1064 nm as measured on a Shimadzu MPC-3100 Spectrophotometer (available from Shimadzu Scientific Inc., Columbia, Md.).

The thermal color transfer donor sheets described in the following Examples were tested for thermal image transfer onto a glass receptor. The color donor sheets within each Example set were sequentially imaged and transferred onto a 1.1 mm thick, 2 inches×2 inches glass receptor sheet. Imaging was performed in a flat-bed imaging system, using a Nd:YAG laser, operating at 7.5 Watts on the donor film plane with a 140 micron laser spot size. The laser scan rate was 12 meters/second. Image data was transferred from a mass-memory system and supplied to an acousto-optic modulator which performs the imagewise modulation of the laser. During the imaging process, the donor sheet and the receptor were held in intimate contact with vacuum assistance.

The following comparative example illustrates a transfer color donor without an adhesive topcoat.

Example 1 (Comparative)

A red thermal transfer donor was produced by coating a Color Mosaic® CRY-SO89 red pigment dispersion solution (available from Fuji-Hunt Electronics Technology Co., LTD., Tokyo, Japan) onto a 22.9 cm×29.5 cm (9 inches×12 inches) sheet of black aluminum vapor-coated 4 mil (0.1 mm) polyester film. The solution was coated using a #5 wire wound bar and dried at 80° C. in a convection oven for 2 minutes giving rise to approximate coating weights of 1.0 micrometers. Color Mosaic® CRY-SO89 contains a mixture of C.I. Pigment Red 177, C.I. Pigment Yellow 139, benzyl methacrylate/methacrylic acid copolymer, and dipentaerythritol hexaacrylate monomer in an ethyl-3-ethoxypropionate, methoxypropylacetate and cyclohexanone solvent blend.

The red donor was imaged against a glass receptor to produce parallel but separate line images using the laser-induced thermal transfer method described above. A visual inspection of the resultant donor and the receptor indicated that the image formation on the donor was completed but the transfer of the colored images onto the glass receptor was incomplete. About 40% of the formed images remained on the donor sheet after separating the donor from the glass receptor. However, the remaining images on the donor were easily separated from the donor sheet with a Scotch™ Brand pressure sensitive adhesive tape, indicating poor transfer of the color layer to the receptor surface. The images did not transfer well primarily due to the lack of adhesion to the receptor.

The following example illustrates the effect of adding an adhesive topcoat onto the thermal transfer layer of a donor sheet.

Example 2 (Comparative)

The red thermal transfer donor described in Example 1 was overcoated with the following adhesive topcoat solution.

| Adhesive Topcoat solution: | |
|---|---|
| Elvacite ® 2776 (polyacrylic resin available from ICI Acrylics, Inc., Wilmington, DE) | 10.0 g |
| Methyl ethyl ketone | 90.0 g |

The adhesive solution was coated onto the thermal transfer layer using a #6 wire wound bar and dried at 80° C. for 2 minutes.

The resulting red thermal transfer donor was imaged against a glass receptor, using the imaging method described above. The results indicated a more complete transfer of the images to the receptor than illustrated in Example 1. Under 20× power microscopic examination, the resultant image on the receptor had a line width ranging from 55 to 100 microns and a very rough line edge having fragmented patterns on both sides of the image lines. Even though the transfer was complete, the uniformity and resolution of the image was poor.

The following example illustrates the effect of adding a thermally transferable infrared sensitive adhesive topcoat onto a colored thermal transfer donor sheet.

Example 3

The red thermal transfer donor sheet described in Example 1 was overcoated with the following thermally transferable infrared sensitive adhesive topcoat solution:

| Thermally transferable infrared sensitive adhesive topcoat solution: | |
|---|---|
| IR-165 Dye (8% by weight in MEK) | 1.875 g |
| Elvacite ® 2776 (polyacrylic resin available from ICI Acrylics Inc., Wilmington, DE; 10% by weight in MEK) | 5.0 g |

The adhesive solution was coated onto the colored thermal transfer layer with a #6 wire wound bar and dried at 80° C. for 2 minutes. The adhesive layer had an absorbance of 0.8 at 1064 nm.

The resulting red donor sheet was imaged against a glass receptor using the imaging method described above. The results showed a very good transfer of the images to the glass receptor. The comparative results were significantly better than Examples 1 and 2. Under 200× power microscopic examination, the resultant image on the receptor had a line width of 105 microns and a sharp line edge having no signs of fragmented patterns on either side of the imaged lines.

The following Example illustrates a different type of comparative thermal transfer donor without an adhesive layer.

Example 4 (Comparative)

A 4 mil (0.001 mm) polyester film was coated with the following light-to heat conversion layer solution:

| Light-to-heat conversion layer solution | |
|---|---|
| IR-165 Dye (8% by weight in MEK) | 1.32 g |
| Borden SP-126A (Novolac resin, available from Borden Chemical, Columbus, OH; 10% by weight in MEK) | 1.3 g |
| FC-431 (fluorochemical surfactant, available from 3M, St. Paul, MN; 10% by weight in MEK) | 0.2 g |

The light-to-heat conversion layer solution was coated with a #4 wire wound bar and dried at 80° C. for 2 minutes. The dried film had a light absorbance of 0.59 at 1064 nm measured on a Shimadzu MPC-3100 Spectrophotometer.

The red thermal transfer solution described in Example 1 was coated onto the above light-to-heat conversion layer using a #5 wire wound bar and dried with heated air at 80° C. for 2 minutes giving rise to approximate coating weight of 1.5 micrometers. The resultant donor sheet was imaged against a glass receptor using the imaging method described above. Under microscopic examination, the resulting images on the glass receptor had a line width of 90 microns and a somewhat fragmented line edge.

The following example illustrates the effect of adding an adhesive topcoat onto the thermal transfer layer of the donor sheet of Example 4.

Example 5 (Comparative)

The red thermal transfer donor sheet described in Example 4 was overcoated with the following thermally transferable adhesive topcoat solution:

| Thermally transferable adhesive topcoat solution: | |
|---|---|
| Elvacite ® 2776 (polyacrylic resin available from ICI Acrylics Inc., Wilmington, DE; 10% by weight in MEK) | 5.0 g |

The adhesive solution was coated onto the colored thermal transfer layer with a #6 wire wound bar and dried at 80° C. for 2 minutes. The resulting donor sheet was imaged against a glass receptor using the imaging method described above. Under microscopic examination, the resultant image on the receptor had a line width between 90 and 98 microns and a rough line edge having fragmented patterns on both sides of the line image.

The following example illustrates the effect of adding a thermally transferable infrared sensitive adhesive topcoat onto a colored thermal transfer donor sheet of Example 4.

Example 6

The red thermal transfer donor sheet described in Example 4 was overcoated with the following thermally transferable infrared sensitive adhesive topcoat solution:

| Thermally transferable infrared sensitive adhesive topcoat solution: | |
|---|---|
| IR-165 Dye (8% by weight in MEK) | 1.875 g |
| Elvacite ® 2776 (polyacrylic resin available from ICI Acrylics Inc., Wilmington, DE; 10% by weight in MEK) | 5.0 g |

The adhesive solution was coated onto the colored thermal transfer layer with a #6 wire wound bar and dried at 80° C. for 2 minutes. The adhesive layer had an absorbance of 0.8 at 1064 nm. The resulting red donor sheet was imaged against a glass receptor using the imaging method described above. The results showed a very good transfer of the images to the receptor. Under microscopic examination, the resultant image on the receptor had a line width of 110 microns and a sharp line edge. The sharpness of the line was significantly better than the image in Example 5.

Table 1 summarizes the imaging results observed in Examples 1–6.

TABLE 1

| Example No. | Line Width | Edge Sharpness |
|---|---|---|
| 1 (comparative) | Incomplete transfer | Incomplete transfer |
| 2 | 55 to 100 microns | fragmented |
| 3 | 105 microns | uniform |
| 4 (comparative) | 90 microns | fragmented |
| 5 (comparative) | 90 to 98 microns | fragmented |
| 6 | 110 microns | uniform |

The results in Table 1 clearly show that the addition of an infrared absorbing adhesive topcoat enhances both the transfer efficiency of the image and the resolution of the transferred image.

We claim:

1. An imaging system comprising:
(i) a thermal color transfer element comprising a substrate having deposited thereon in the following order;
(a) a light-to-heat conversion layer;
(b) a color transfer layer; and
(c) a thermally transferable infrared sensitive adhesive topcoat comprising an infrared absorber and a thermoplastic material; and
(ii) a receptor in intimate contact with the adhesive topcoat of the thermal transfer element.

2. The imaging system claim 1 wherein said light-to-heat conversion layer comprises a metal or metal/metal oxide.

3. The imaging system of claim 1 wherein said light-to-heat conversion layer comprises an infrared absorber and a binder.

4. The imaging system of claim 1 wherein said color transfer layer comprises a pigment.

5. The imaging system claim 1 wherein said color transfer layer further comprises polymerizable materials and an initiator system.

6. The imaging system of claim 1 wherein said infrared sensitive adhesive topcoat has a thickness between 0.05 and 2.0 micron.

7. The imaging system claim 1 wherein said infrared sensitive adhesive topcoat has a thickness between 0.1 and 0.5 micron.

8. The imaging system of claim 1 wherein said infrared sensitive adhesive topcoat further comprises a crosslinker.

9. A process for transferring an image onto a receptor comprising the steps of
a) placing in intimate contact said receptor and a thermal color transfer element comprising a substrate having deposited thereon in the following order,
(i) a light-to-heat conversion layer,
(ii) a color transfer layer, and
(iii) a thermally transferable infrared sensitive adhesive topcoat comprising an infrared absorber and a thermoplastic material, wherein said adhesive topcoat is in contact with said receptor;

b) exposing said thermal transfer element in an imagewise pattern with an infrared radiation source heating (iii); and c) simultaneously transferring said color transfer layer and said thermally transferable adhesive topcoat corresponding to said imagewise pattern to said receptor to form a transferred image on said receptor.

10. The process of claim 9 wherein said infrared radiation source is an infrared laser.

11. The process of claim 10 wherein said infrared laser has a focal length equal to the combined thicknesses of said light-to-heat conversion layer, said color layer and said infrared sensitive adhesive topcoat.

12. The process of claim 9 wherein said light-to-heat conversion layer comprises a metal or metal/metal oxide.

13. The process of claim 9 wherein said light-to-heat conversion layer comprises an infrared absorber and a binder.

14. The process of claim 9 wherein said color transfer layer comprises a pigment.

15. The process of claim 9 wherein said color transfer layer further comprises polymerizable materials and an initiator system.

16. The process of claim 15 further comprising the step of d) exposing said transferred image to a second radiation source.

17. The process of claim 9 wherein said infrared sensitive adhesive topcoat further comprises a crosslinker.

18. The process of claim 17 further comprising the step of d) exposing said transferred image to a second radiation source.

19. A process for transferring an image onto a receptor comprising the steps of a) placing in intimate contact said receptor and a thermal color transfer element comprising a substrate having deposited thereon in the following order, (i) a light-to-heat conversion layer, (ii) a color transfer layer comprising a colorant, polymerizable materials and an initiator system, and (iii) a thermally transferable infrared sensitive adhesive topcoat comprising an infrared absorber and a thermoplastic material, wherein said adhesive topcoat is in contact with said receptor;

b) exposing said thermal transfer element in an imagewise pattern with an infrared radiation source;

c) simultaneously transferring said color transfer layer and said thermally transferable adhesive topcoat corresponding to said imagewise pattern to said receptor to form a transferred image on said receptor; and d) exposing said transferred image to a second radiation source.

* * * * *